United States Patent
Canard et al.

[11] Patent Number: 6,163,182
[45] Date of Patent: Dec. 19, 2000

[54] LOW-NOISE FREQUENCY DIVIDER

[75] Inventors: David Canard, Caen; Vincent Fillatre, Thaon, both of France

[73] Assignee: U.S. Philips Corporation, New York, N.Y.

[21] Appl. No.: 09/060,089

[22] Filed: Apr. 14, 1998

[30] Foreign Application Priority Data

Apr. 15, 1997 [FR] France ................................ 97 04598

[51] Int. Cl.⁷ .................................................. H03K 21/00
[52] U.S. Cl. ............................................. 327/117; 327/115
[58] Field of Search ................................. 327/115, 117, 327/118; 377/47, 48

[56] References Cited

U.S. PATENT DOCUMENTS

| | | | |
|---|---|---|---|
| 5,020,082 | 5/1991 | Takeda | 377/44 |
| 5,172,400 | 12/1992 | Maemura | 377/116 |
| 5,524,037 | 6/1996 | Donig et al. | 377/108 |

FOREIGN PATENT DOCUMENTS 54-084471A  5/1979  Japan .
07321642A  12/1995  Japan .

OTHER PUBLICATIONS

"Frequency Dividers For Ultra–High Frequencies" by W.D. Kasperkovitz, Philips Technical Review 38, 1978/79, No. 2, pp. 54–68.

"PLL–Synthesizerschaltkreis U 1056 D", by K.D. Moller, Radio Fernsehen Elektronik, vol. 39, No. 4, 1990, pp. 230, 261–263.

*Primary Examiner*—Tuan T. Lam
*Attorney, Agent, or Firm*—Steven R. Biren

[57] ABSTRACT

A frequency divider DIV/4 composed of memory cells (DL1 . . . DL4) realized in ECL technology, whose data paths constitute a loop, the data output Q4 of the last memory cell DL4 being cross-connected to the data input D1 of the first memory cell DL1. The clock inputs Ck of the memory cells DL1, DL3 of the odd rank are connected to the input IN of the frequency divider circuit DIV/4, while the others are cross-connected to said input. Such a frequency divider generates a noise having a unique frequency which is twice the frequency of the input signal, irrespective of the division ratio obtained.

2 Claims, 3 Drawing Sheets

LOW-NOISE FREQUENCY DIVIDER

BACKGROUND OF THE INVENTION

The invention relates to an integrated circuit comprising a frequency divider having a symmetrical input which is intended to receive a signal having a first frequency, and a symmetrical output which is intended to receive a signal having a second frequency whose value is 2.N times lower than that of the first frequency, in which N is a predetermined integer which is at least equal to 2, the frequency divider being composed of memory cells realized in ECL technology, each having a symmetrical data input, a symmetrical clock input and a symmetrical data output.

An integrated circuit comprising a frequency divider is described in the article "Frequency dividers for ultra-high frequencies" by W. D. Kasperkovitz, published in Philips Technical Review 38 54–68, 1978/79 no. 2. This article describes the architecture of a memory cell realized in ECL technology, as well as a two-to-one divider using two of these memory cells. Each of these comprises a first and a second transistor constituting a first differential pair whose emitters are jointly connected to a negative power supply terminal via a current source, and whose bases constitute the symmetrical clock input of the memory cell. Each memory cell also comprises a third and a fourth transistor constituting a second differential pair, whose emitters are jointly connected to the collector of the first transistor, whose bases constitute the symmetrical data input of the memory cell and whose collectors are connected to a positive power supply terminal via load resistors. Each memory cell also comprises a fifth and a sixth transistor constituting a third differential pair, whose emitters are jointly connected to the collector of the second transistor, whose bases are connected to the collectors of the fourth and third transistors, respectively, and whose collectors are connected to the collectors of the third and fourth transistors, respectively.

The two-to-one divider described in this article comprises two of these memory cells. The data output of the first memory cell is connected to the data input of the second memory cell, the data output of the second memory cell being cross-connected to the data input of the first memory cell, the data output of the second memory cell constituting, in this embodiment, the output of the frequency divider circuit, the clock input of the first memory cell being connected to the input of the frequency divider circuit, the clock input of the second memory cell being cross-connected to said input. It is possible to use such a two-to-one divider for realizing a frequency divider circuit having a frequency division ratio number of $2^M$, in which M is an arbitrary integer, by cascade-arranging M two-to-one dividers conforming to the previously described structure, the first two-to-one divider receiving an input signal at its input, the output of each two-to-one divider being connected to the input of the subsequent two-to-one divider, except the output of the last two-to-one divider which constitutes the output of the frequency divider circuit. This structure has the advantage that it can function at very high frequencies, i.e. when the frequency of the input signal has, for example, GHz values. However, it has also major drawbacks. The differential pairs included in the memory cells of each two-to-one divider switch at each half cycle of the input signal. This results in the appearance of current peaks in the power supply terminals at each half cycle of the input signal of each two-to-one divider. These current peaks constitute noise, i.e. parasitic signals which propagate throughout the integrated circuit, because all of the components included therein are directly or indirectly connected to the power supply terminals. This noise has as many harmonics as there are cascade-arranged two-to-one dividers. Whereas certain harmonics only have little effect on the operation of the integrated circuit, others may be particularly detrimental. Finally, the structure described above does not allow a division by an even number which does not constitute a power of two.

SUMMARY OF THE INVENTION

It is an object of the invention to remedy these drawbacks to a great extent by proposing a frequency divider which generates a single parasitic signal having a unique frequency irrespective of the division ratio between its input signal and its output signal, while said ratio can be chosen as an arbitrary multiple of two.

To this end, an integrated circuit comprising a frequency divider according to the invention is characterized in that the frequency divider comprises 2.N memory cells of the above-mentioned type, the data output of the $i^{th}$ memory cell, referred to as memory cell of rank i, being connected, for i=1 to 2.N−1, to the data input of the memory cell of rank i+1, the data output of the memory cell of rank 2.N being cross-connected to the data input of the memory cell of rank 1, the data output of one of the memory cells constituting the output of the frequency divider circuit, the clock input of each memory cell of an odd rank being connected to the input of the frequency divider circuit, the clock input of each memory cell of an even rank being cross-connected to said input.

All of the memory cells included in such a frequency divider receive the same input signal or its inverse value. Consequently, the noise generated in the power supply terminals only has a single harmonic whose frequency is twice the frequency of the input signal of the frequency divider, irrespective of the division ratio obtained with the aid thereof. Such a frequency divider thus constitutes a filter for parasitic signals which enables only a single harmonic to be generated. Moreover, it allows a division of the value of the input frequency by an arbitrary even number. However, a division ratio of the value of 2.N involves the use of 2.N memory cells. In comparison with a structure composed of known cascade-arranged two-to-one dividers, a frequency divider according to the invention is thus less economical in terms of silicon surface required for its realization, as soon as 2.N>4. It may thus be advantageous to combine the two structures within one and the same frequency divider which will then comprise a succession of cascade-arranged two-to-one dividers among which at least one frequency divider according to the invention will be inserted. The position occupied by this divider in the chain of known two-to-one dividers will determine which harmonics will be suppressed thereby.

A frequency divider as described above may be used within a programmable frequency divider. In one of its variants, the invention proposes an integrated circuit comprising a programmable frequency divider having a first input which is intended to receive a signal having an input frequency, a second input which is intended to receive a control signal, and an output, the programmable frequency divider comprising:

a first frequency divider having an input constituting the input of the programmable frequency divider, and an output which is intended to supply a signal having an intermediate frequency whose value is 2.P times lower than that of the input frequency, in which P is a predetermined integer, a second frequency divider having an input connected to the output of the first frequency divider, and an output constituting the output of the programmable frequency divider, which output is intended to supply a signal having an output frequency whose value is K times lower than that of the intermediate frequency, in which K is a real number whose value is determined by the value of the control signal, characterized in that, with P being higher than or equal to N, the first frequency divider comprises at least a frequency divider circuit as described above.

The presence of frequency dividers according to the invention, judiciously arranged within the first frequency divider, allows filtering of parasitic signals whose frequencies are most detrimental, as will be seen hereinafter.

Frequency selection devices used, inter alia, in television receivers for selecting radio-electric signals, use programmable frequency dividers, notably in phase-locked loops allowing selection of a particular radio-electric signal.

The invention thus also relates to a selection device having a signal input which is intended to receive a radio-electric signal, a second control input which is intended to receive a control signal defining the frequency of a radio-electric signal to be selected, and an output, said device comprising:

an oscillator having a tuning input and an output which is intended to supply a signal whose frequency depends on the value of a signal applied to its tuning input, a mixer having a first input constituting the signal input of the device, a second input connected to the output of the oscillator, and an output constituting the output of the device, which output is intended to supply a signal whose frequency is equal to the difference between the frequency of the signal received at its first input and that of the signal received at its second input, a programmable frequency divider having a first input connected to the output of the oscillator, a second input constituting the control input of the device, and an output which is intended to supply a signal whose frequency is defined by the value of the control signal, a phase detector having a first input which is intended to receive a reference signal whose frequency is fixed, a second input connected to the output of the frequency divider, and an output connected to the tuning input of the oscillator, and provided with means for supplying, at its output, a signal whose value depends on the difference between the phases of its input signals, said device being characterized in that the programmable frequency divider is a frequency divider as described above.

The harmonics which are most detrimental to the operation of this selection device are notably those having frequencies which are equal to the frequency of the output signal of the oscillator, to a quarter and to one-eighth of said frequency. A filtering of these harmonics may be realized by virtue of the present invention.

These and other aspects of the invention are apparent from and will be elucidated with reference to the embodiments described hereinafter.

DETAILED DESCRIPTION OF THE PREFERRED EMBODIMENTS

Figure 1:
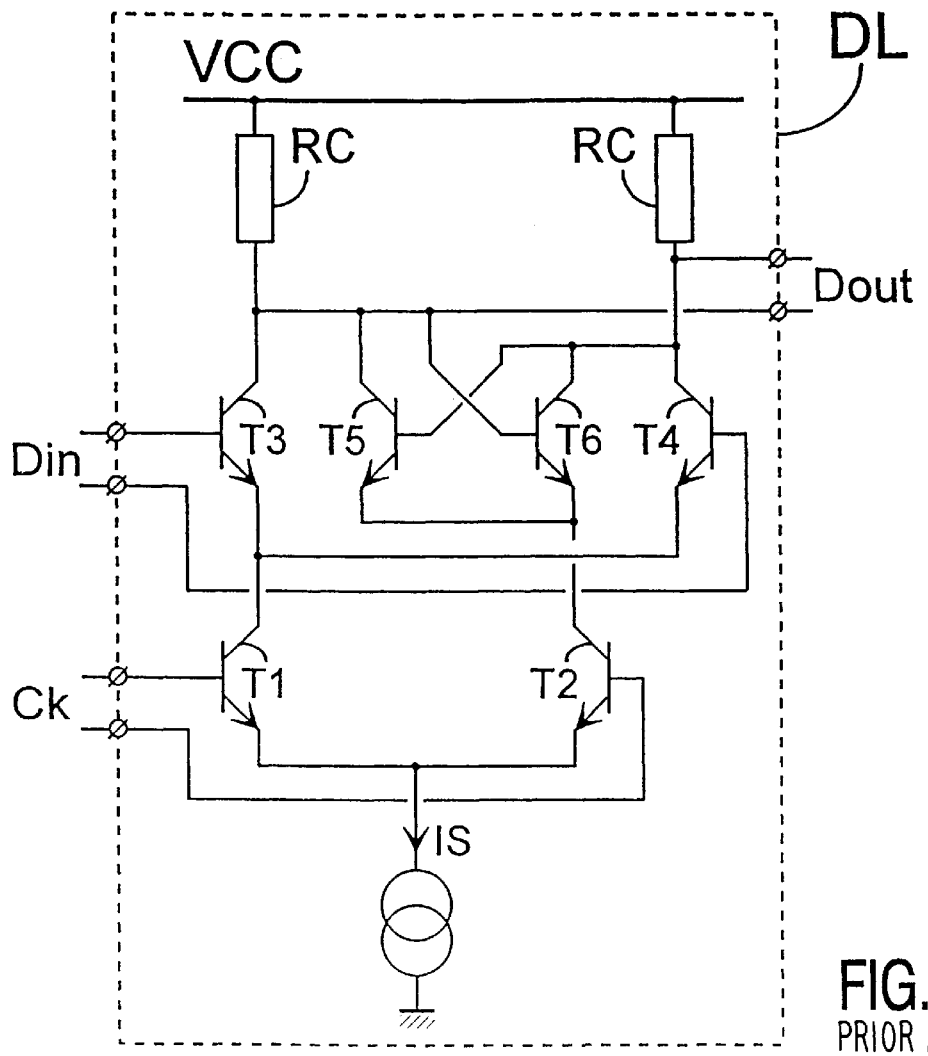
FIG. 1 is an electric circuit diagram showing a known memory cell realized in ECL technology.

FIG. 1 shows diagrammatically a known memory cell DL realized in ECL technology. This memory cell DL comprises a first transistor T1 and a second transistor T2 constituting a first differential pair, whose emitters are jointly connected, via a current source for supplying a current IS, to a negative power supply terminal constituted, in this case, by the circuit's ground, and whose bases constitute a symmetrical clock input Ck of the memory cell DL. The memory cell DL also comprises a third transistor T3 and a fourth transistor T4 constituting a second differential pair, whose emitters are jointly connected to the collector of the first transistor T1, whose bases constitute a symmetrical data input Din of the memory cell DL and whose collectors are connected to a positive power supply terminal VCC via load resistors RC. The memory cell DL also comprises a fifth transistor T5 and a sixth transistor T6 constituting a third differential pair, whose emitters are jointly connected to the collector of the second transistor T2, whose bases are connected to the collectors of the fourth and third transistors T4 and T3, respectively, and whose collectors, connected to the collectors of the third and fourth transistors T3 and T4, respectively, constitute a symmetrical data output Dout of the memory cell DL.

When the clock input Ck receives a positive clock signal, the first transistor T1 is turned on and the second transistor T2 is turned off. The first transistor T1 then activates the second differential pair, i.e. the state of the third and fourth transistors T3 and T4 constituting this pair is determined by the state of a data signal applied to the data input Din of the memory cell DL. If, for example, this data signal is positive, the third transistor T3 is turned on, whereas the fourth transistor T4 is turned off. The memory cell DL then supplies a positive signal at its data output Dout. When the clock signal becomes negative, the second pair of transistors T3, T4 is deactivated because the first transistor T1 is turned off, but, with the second transistor T2 being then turned on, the third pair of transistors T5, T6 is activated. The potential of the collector of the third transistor T3 is then applied to the base of the sixth transistor T6, while that of the fourth transistor T4 is applied to the base of the fifth transistor T5. The fifth and sixth transistors T5 and T6 are turned on and off, respectively, in this case, when the clock signal becomes negative after the data input Din has received a positive signal during a positive state of the clock signal. The signal supplied by the memory cell DL at its data output Dout thus remains positive. The signal which has been applied to the data input Din of the memory cell DL is thus stored during at least one cycle of the clock signal applied to said memory cell. A similar reasoning may be applied in the case where a negative signal would be applied to the data input Din of the memory cell DL.

It is thus found that the first transistor T1 is turned on during a positive state of the clock signal, and the second transistor T2 is turned on during a negative state of the clock signal. This means that, during the same clock signal cycle, the second and third differential pairs are alternately activated by turning on either the first or the second transistor, respectively. The transitions between the activation of one of these differential pairs and the deactivation of the other causes the appearance of parasitic signals in the power supply terminals, which parasitic signals have a frequency which is the frequency of the clock signal.

Figure 2:
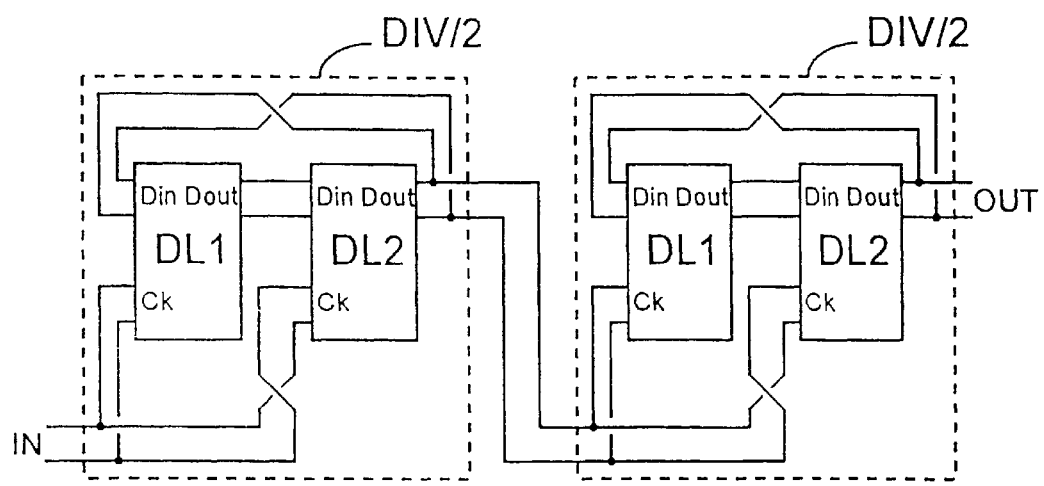
FIG. 2 is a functional diagram showing a known frequency divider.

FIG. 2 shows diagrammatically a known four-to-one divider constituted by two two-to-one dividers DIV/2 arranged in cascade, each using two memory cells DL1 and DL2 as described above. Within each of these two-to-one dividers DIV/2, the data output Dout of the first memory cell DL1 is connected to the data input Din of the second memory cell DL2, the data output Dout of the second memory cell DL2 being cross-connected to the data input Din of the first memory cell DL1, the data output Dout of the second memory cell constituting, in this embodiment, the output of the two-to-one divider DIV/2. The clock input Ck of the first memory cell DL1 is connected to the input of the two-to-one divider DIV/2, the clock input Ck of the second memory cell DL2 being cross-connected to said input. The two two-to-one dividers DIV/2 are arranged in cascade, the first two-to-one divider DIV/2 receiving an input signal IN at its input, the output of said first two-to-one divider being connected to the input of the second two-to-one divider DIV/2, whose output constitutes the output OUT of the frequency divider. This structure has the advantage that it can function at very high frequencies, i.e. when the frequency of the input signal has, for example, GHz values. This is due to the switching speed of the bipolar transistors which constitute the memory cells DL in ECL technology. However, it has also drawbacks in terms of noise. As described hereinbefore, the differential pairs included in the memory cells DL1, DL2 of each two-to-one divider DIV/2 switch at each half cycle of the input signal. This results in the appearance of current peaks applied to the power supply terminals at each half cycle of the input signal of each two-to-one divider. If the frequency of the signal applied to the input IN of the first two-to-one divider DIV/2 is denoted as Fin, the differential pairs of the first two-to-one divider DIV/2 generate a parasitic signal at the frequency 2.Fin in the power supply terminals, while the differential pairs of the second two-to-one divider DIV/2, which receives a signal at its input whose frequency is equal to Fin/2, generate a parasitic signal at the frequency Fin in the power supply terminals. These parasitic signals propagate throughout the integrated circuit, because all of the components included therein are directly or indirectly connected to said power supply terminals. These parasitic signals constitute a noise which thus has two harmonics in this case, whose frequencies are 2.Fin and Fin, respectively. Finally, it appears clearly that the structure described above does not allow a division by an even number which does not constitute a power of two, because the cascade arrangement of M two-to-one dividers of the type described above will yield a division ratio of $2^M$ between the value of the frequency of the signal applied to its input IN and that of the frequency of the signal supplied at its output OUT.

Figure 3:
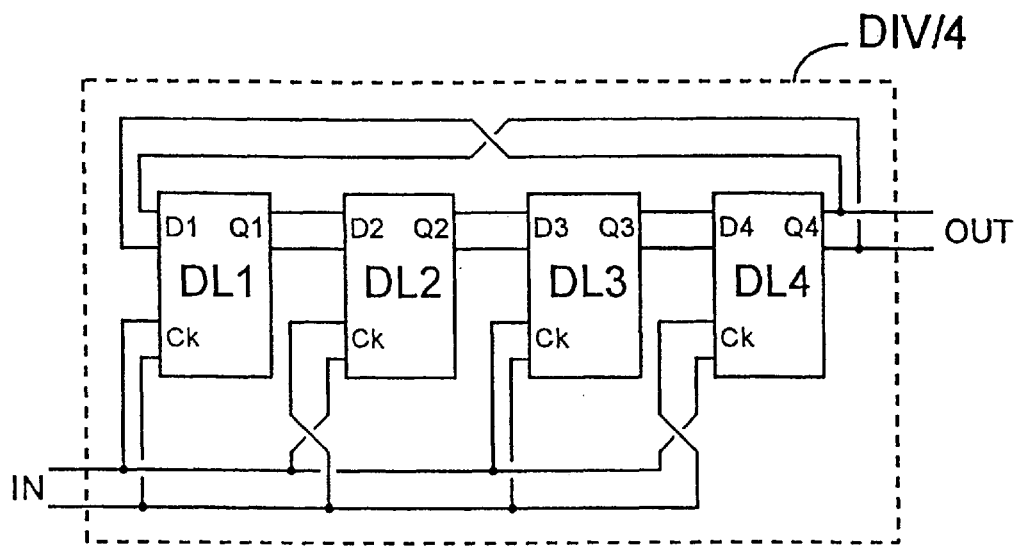
FIG. 3 is a functional diagram showing a frequency divider according to the invention.

FIG. 3 shows diagrammatically a frequency divider DIV/4 in accordance with the invention, provided with a symmetrical input IN which is intended to receive a signal having a frequency Fin, and a symmetrical output OUT which is intended to supply a signal having a frequency Fout, whose value is 4 times lower than that of the first frequency Fin. This frequency divider DIV/4 is composed of memory cells realized in ECL technology as described above, each provided with a symmetrical data input Di (for i=1 to 4), a symmetrical clock input Ck and a symmetrical data output Qi (for i=1 to 4). The data output Qi of the $i^{th}$ memory cell, referred to as memory cell of rank i, is connected, for i=1 to 3, to the data input Di of the memory cell of rank i+1. The data output Q4 of the memory cell of rank 4 is cross-connected to the data input D1 of the memory cell of rank 1. Said data output Q4 here constitutes the output of the frequency divider circuit DIV/4. The clock input Ck of each memory cell DL1, DL3 of odd rank is connected to the input IN of the frequency divider circuit DIV/4, the clock input Ck of each memory cell DL2, DL4 of even rank being cross-connected to said input.

Figure 4:
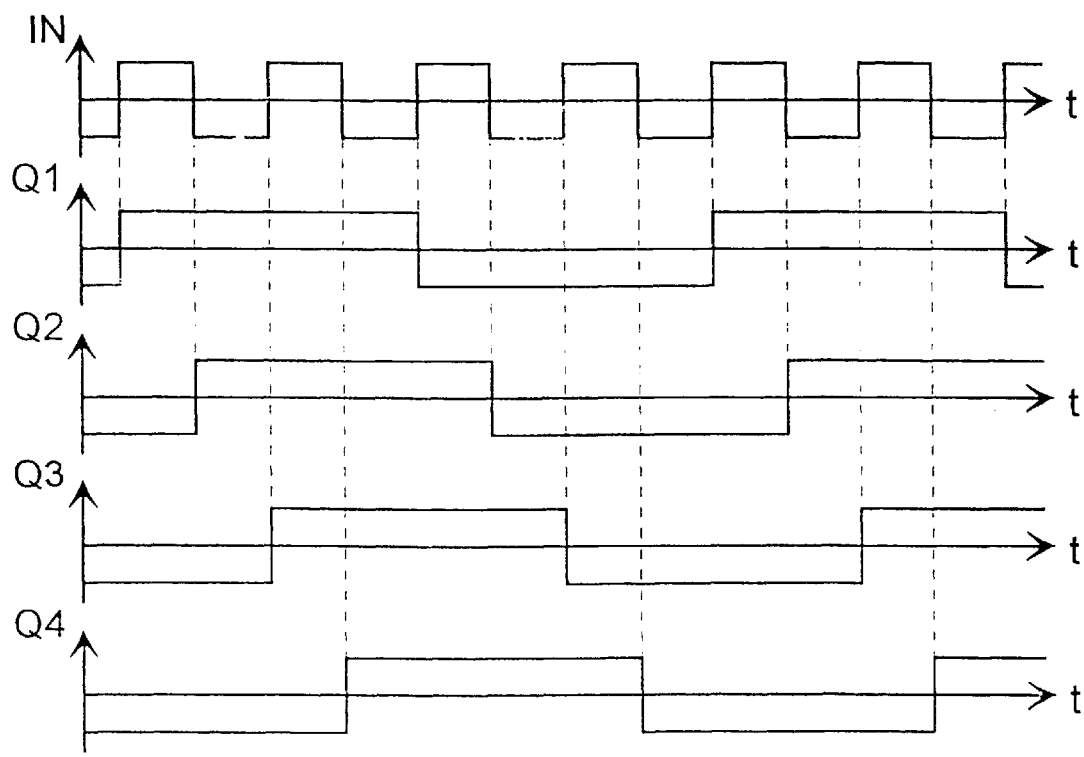
FIG. 4 is a set of chronograms showing the development of signals in a frequency divider according to the invention.

FIG. 4 is a set of chronograms intended to illustrate the operation of such a frequency divider. If one chooses, for example, an initial state in which the output Q4 of the fourth memory cell DL4 is negative when the signal applied to the input IN of the divider is negative, this means that the signal present at the data input D1 of the first memory cell DL1 is positive. When the input signal becomes positive, the first memory cell DL1 duplicates the positive state applied at its data input D1 to its data output Q1. This positive state is then transmitted to the data input D2 of the second memory cell DL2. When the input signal becomes negative, the first memory cell DL1 memorizes the positive state previously applied to its data input D1 and restores it at its data output Q1. The second memory cell DL2 duplicates the positive state applied at its data input D2 to its data output Q2. This positive state is then transmitted to the data input D3 of the third memory cell DL3. This process is repeated until the fourth memory cell DL4 duplicates a positive state previously applied at its data input D4 to its data output Q4. The signal present at the data input D1 of the first memory cell DL1 then becomes negative, and at the next positive state of the input signal of the divider, the first memory cell DL1 restores the negative state applied at its data input D1 to its data output Q1. This negative state subsequently propagates through the divider in accordance with a process which is identical to that described above. Thus it is found that each one of the outputs Qi of the memory cells DLi (for i=1 to 4) supplies a periodical signal whose cycle is four times longer than that of the signal applied to the input of the frequency divider, which means that the frequency of each of these output signals is equal to Fin/4 if Fin is the frequency of the signal applied to the input of the frequency divider. On the other hand, since all of the memory cells DLi (for i=1 to 4) receive the same input signal or its inverse value, both at the frequency Fin, all the differential pairs included in the frequency divider switch twice in a synchronous manner in the course of each cycle of the input signal and thus generate only a single parasitic signal of the frequency 2. Fin in the power supply terminals. More generally, the structure of the frequency divider according to the invention thus allows elimination of the parasitic signals whose frequencies are lower than or double the frequency of the signal received at its input, irrespective of the number of memory cells in this divider. Moreover, it is evident from the description given with reference to the operation of a four-to-one divider, that a similar structure comprising an arbitrary number of 2.N memory cells allows a division ratio which is equal to 2.N, with which division ratios other than powers of two can be obtained. It should also be noted that a frequency divider according to the invention generates, at each of the outputs of the 2.N memory cells included in this divider, 2.N signals which are successively shifted in phase by a value of π/(2.N). This property may be exploited advantageously in certain applications where the frequency divider will be used as a generator of out-of-phase signals.

Figure 5:
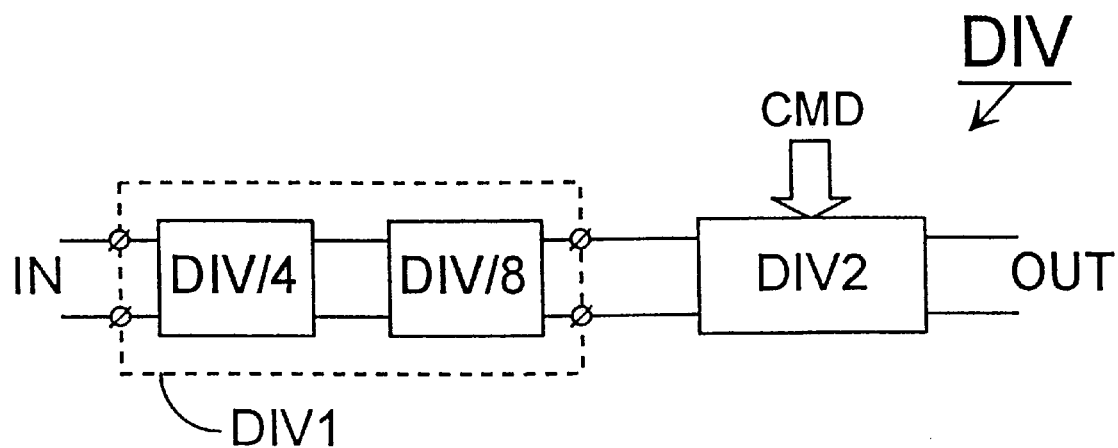
FIG. 5 is a functional diagram showing a programmable frequency divider in accordance with a variant of the invention.

FIG. 5 shows diagrammatically a programmable frequency divider DIV in accordance with a variant of the invention, provided with a first input IN which is intended to receive a signal having a frequency Fin referred to as input frequency, a second input which is intended to receive a control signal CMD, and an output OUT. This programmable frequency divider DIV comprises:

- a first frequency divider DIV1 having an input constituting the input IN of the programmable frequency divider DIV, and an output which is intended to supply a signal having an intermediate frequency whose value is 32 times lower than that of the input frequency Fin,
- a second frequency divider DIV2 having an input connected to the output of the first frequency divider DIV1, and an output constituting the output OUT of the programmable frequency divider DIV, which output is intended to supply a signal having an output frequency Fout whose value is K times lower than that of the intermediate frequency Fin/32, in which K is a real number whose value is determined by the value of the control signal CMD.

The first frequency divider DIV1 comprises a frequency divider DIV/4 in accordance with the invention and as described above, having a division ratio of 4, and a frequency divider DIV/8 in accordance with the invention, having a division ratio of 8.

The division ratio R=Fin/Fout obtained by means of this programmable divider DIV is 32.K. The implementation of the first frequency divider calls for the use of 4 memory cells for DIV/4 and 8 memory cells for DIV/8. A division ratio of 32 could be obtained by means of five two-to-one dividers arranged in cascade, i.e. 10 memory cells. Such an arrangement would, however, generate parasitic signals having 2.Fin, Fin, Fin/2, Fin/4 and Fin/8 as harmonics. In conformity with what has been described above, the frequency divider DIV1 generates only two harmonics 2.Fin and Fin/2. Although the structure of the frequency divider is more cumbersome than the known structure, the enhenced spectral purity which it provides renders it very advantageous, particularly at high frequencies. Moreover, the filtering which it makes possible is easily adaptable. In the example described here, a permutation of the two dividers DIV/4 and DIV/8 would provide the possibility, at the same division ratio of 32, of preserving only the harmonics 2.Fin and Fin/4 in an application where this would prove to be least detrimental to the operation of the circuit.

Figure 6:
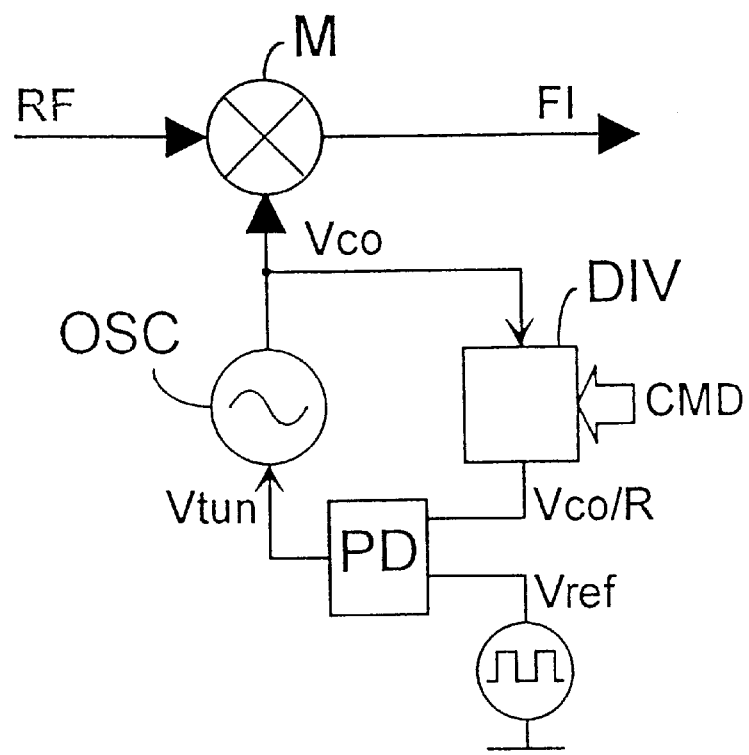
FIG. 6 is a functional diagram showing a selection device in which a programmable frequency divider according to the invention is used.

FIG. 6 shows diagrammatically a selection device in which a programmable frequency divider according to the invention is used. This device has a signal input receiving a radio-electric signal RF whose frequency is referred to as radio frequency. This device is also provided with a control input receiving a control signal CMD defining the frequency of a radio-electric signal to be selected from an assembly of signals whose radio frequencies are situated in a given range. The device also has an output supplying a signal FI having a fixed intermediate frequency. The device comprises:

- an oscillator OSC having a tuning input and an output supplying a signal Vco whose frequency, denoted FLO, depends on the value of a tuning signal Vtun applied to its tuning input,
- a mixer M having a first input constituting the signal input of the device and receiving the radio-electric signal RF, a second input connected to the output of the oscillator OSC, and an output, constituting the output of the device, and supplying a signal FI whose intermediate frequency is equal to the difference between the frequency of the signal RF received at its first input and that of the signal Vco received at its second input,
- a programmable frequency divider DIV having a first input connected to the output of the oscillator OSC, a second input constituting the control input of the device, and an output supplying a signal Vco/R whose frequency is equal to the frequency of the signal Vco received at its first input, divided by a number defined by the control signal CMD received at its second input,
- a phase detector PD having a first input receiving a reference signal Vref whose frequency is fixed, a second input connected to the output of the frequency divider DIV, and an output connected to the tuning input of the oscillator OSC, and provided with means for supplying, at its output, the signal Vtun whose value depends on the difference between the phases of its input signals.

In such a device, the choice of the ratio between the frequency of the output signal Vco of the oscillator OSC and that of the output signal Vco/R of the frequency divider DIV, which ratio is denoted as R, allows the selection of the radio-electric signal. The intermediate frequency of the signal FI generated by the mixer M is equal to the difference between the radio frequency and the frequency of the output signal Vco of the oscillator OSC. As the value of the intermediate frequency is fixed, which is realized, for example, by means of band-pass filtering (not shown), effected at the output of the mixer M, the frequency of the selected radio-electric signal solely depends on the frequency of the signal Vco. In a phase-locked situation, the frequency of the signal Vco is R times that of the signal Vref. The value of the control signal CMD thus determines the radio frequency of the radio-electric signal RF which will be used after the selection effected by the device.

The harmonics which are most detrimental to the operation of this device are those which have frequencies of FLO, FLO/4 and FLO/8. As has been apparent hereinbefore, these harmonics may be suppressed by using a programmable frequency divider DIV in accordance with the invention.

What is claimed is:

1. An integrated circuit comprising a programmable frequency divider having a first input for receiving a signal having an input frequency, a second input for receiving a control signal, and an output, the programmable frequency divider comprising:

a first frequency divider having an input constituting the input of the programmable frequency divider, and an output for supplying a signal having an intermediate frequency whose value is 2.P times lower than that of the input frequency, in which P is a predetermined integer, a second frequency divider having an input connected to the output of the first frequency divider, and an output constituting the output of the programmable frequency divider for supplying a signal having an output frequency whose value is K times lower than that of the intermediate frequency, in which K is a real number whose value is determined by the value of the control signal, characterized in that, with P being higher than or equal to N, the first frequency divider comprises a frequency divider circuit having a symmetrical input for receiving a signal having a first frequency, and a symmetrical output for providing a signal having a second frequency whose value is 2.N times lower than that of the first frequency, in which N is a predetermined integer which is at least equal to 2, the frequency divider being composed of memory cells realized in ECL technology, each having a symmetrical data input, a symmetrical clock input and a symmetrical data output, characterized in that the frequency divider comprises 2.N memory cells of the above-mentioned type, the data output of the $i^{th}$ memory cell, referred to as memory cell of rank i, being connected, for i=1 to 2.N−1, to the data input of the memory cell of rank i+1, the data output of the memory cell of rank 2.N being cross-connected to the data input of the memory cell of rank 1, the data output of one of the memory cells constituting the output of the frequency divider circuit, the clock input of each memory cell of an odd rank being connected to the symmetrical input of the frequency divider circuit, the clock input of each memory cell of an even rank being cross-connected to said symmetrical input.

2. A selection device having a signal input for receiving a radio-electric signal, a second control input for receiving a control signal defining the frequency of a radio-electric signal to be selected, and an output, said device comprising:

an oscillator having a tuning input and an output for supplying a signal whose frequency depends on the value of a signal applied to its tuning input, a mixer having a first input constituting the signal input of the device, a second input connected to the output of the oscillator, and an output constituting the output of the device for supplying a signal whose frequency is equal to the difference between the frequency of the signal received at its first input and that of the signal received at its second input, a programmable frequency divider having a first input connected to the output of the oscillator, a second input constituting the control input of the device, and an output for supplying a signal whose frequency is defined by the value of the control signal, a phase detector having a first input for receiving a reference signal whose frequency is fixed, a second input connected to the output of the programmable frequency divider, and an output connected to the tuning input of the oscillator, and provided with means for supplying, at its output, a signal whose value depends on the difference between the phases of its input signals, said device being characterized in that the programmable frequency divider has having a first input for receiving a signal having an input frequency, a second input for receiving said control signal, and an output, the programmable frequency divider comprising:

a first frequency divider having an input constituting the input of the programmable frequency divider, and an output for supplying a signal having an intermediate frequency whose value is 2.P times lower than that of the input frequency, in which P is a predetermined integer, a second frequency divider having an input connected to the output of the first frequency divider, and an output constituting the output of the programmable frequency divider for supplying a signal having an output frequency whose value is K times lower than that of the intermediate frequency, in which K is a real number whose value is determined by the value of the control signal, characterized in that, with P being higher than or equal to N, the first frequency divider comprises a frequency divider circuit having a symmetrical input for receiving a signal having a first frequency, and a symmetrical output for providing a signal having a second frequency whose value is 2.N times lower than that of the first frequency, in which N is a predetermined integer which is at least equal to 2, the frequency divider being composed of memory cells realized in ECL technology, each having a symmetrical data input, a symmetrical clock input and a symmetrical data output, characterized in that the frequency divider comprises 2.N memory cells of the above-mentioned type, the data output of the $i^{th}$ memory cell, referred to as memory cell of rank i, being connected, for i=1 to 2.N−1, to the data input of the memory cell of rank i+1, the data output of the memory cell of rank 2.N being cross-connected to the data input of the memory cell of rank 1, the data output of one of the memory cells constituting the output of the frequency divider circuit, the clock input of each memory cell of an odd rank being connected to the symmetrical input of the frequency divider circuit, the clock input of each memory cell of an even rank being cross-connected to said symmetrical input.

* * * * *